(12) United States Patent
Harkema (10) Patent No.: US 10,038,168 B2
(45) Date of Patent: Jul. 31, 2018

(54) PHOTOACTIVE BIREFRINGENT MATERIALS IN OLEDS

(71) Applicant: Nederlandse Organisatie voor toegepast-natuurwetenschappelijk onderzoek TNO, s-Gravenhage (NL)

(72) Inventor: Stephan Harkema, 's-Gravenhage (NL)

(73) Assignee: Nederlandse Organisatie voor toegepast-natuurwe-tenschappelijk onderzoek TNO, s-Gravenhage (NL)

( * ) Notice: Subject to any disclaimer, the term of this patent is extended or adjusted under 35 U.S.C. 154(b) by 0 days.

(21) Appl. No.: 15/106,866

(22) PCT Filed: Dec. 22, 2014

(86) PCT No.: PCT/NL2014/050898
§ 371 (c)(1),
(2) Date: Jun. 21, 2016

(87) PCT Pub. No.: WO2015/099528
PCT Pub. Date: Jul. 2, 2015

(65) Prior Publication Data
US 2017/0033320 A1    Feb. 2, 2017

(30) Foreign Application Priority Data
Dec. 23, 2013   (EP) .................... 13199336

(51) Int. Cl.
*H01L 51/52*     (2006.01)
*H01L 51/00*     (2006.01)
(Continued)

(52) U.S. Cl.
CPC ........ *H01L 51/5281* (2013.01); *G02B 5/3016* (2013.01); *H01L 51/0014* (2013.01);
(Continued)

(58) Field of Classification Search
None
See application file for complete search history.

(56) References Cited

U.S. PATENT DOCUMENTS

2002/0079831 A1*  6/2002  He .................... G02B 5/3033
                                                              313/504
2003/0018097 A1   1/2003  O'Neill et al.
(Continued)

FOREIGN PATENT DOCUMENTS

JP         4350969 A        4/2004
WO     WO2006/087654 A1    9/2006
(Continued)

OTHER PUBLICATIONS

K. Neyts, "Simulation of light emission from thin-film microcavities," J. Opt. Soc. Am A vol. 15, No. 4, Apr. 1998.
(Continued)

*Primary Examiner* — Michael Lebentritt
*Assistant Examiner* — Jordan Klein
(74) *Attorney, Agent, or Firm* — Hoffmann & Baron, LLP (57) ABSTRACT

The invention relates to an organic light-emitting diode (OLED) system comprising a multi-layered structure having at least two reflective interfaces, and a semiconducting organic layer sandwiched between first and second electrodes; wherein at least one of the reflective interfaces is semi-transparent to form a microcavity in between the two reflective interfaces; wherein a layer is provided in the microcavity between an electrode and a reflective interface that is formed of a photoactive birefringent material; and wherein the photoactive birefringent material is selectively activated.

15 Claims, 6 Drawing Sheets

(51) Int. Cl.
*H01L 51/56* (2006.01)
*G02B 5/30* (2006.01)

(52) U.S. Cl.
CPC ...... *H01L 51/0096* (2013.01); *H01L 51/5203* (2013.01); *H01L 51/5265* (2013.01); *H01L 51/5271* (2013.01); *H01L 51/56* (2013.01)

(56) References Cited

U.S. PATENT DOCUMENTS

| | | | | |
|---|---|---|---|---|
| 2005/0264715 A1* | 12/2005 | Kahen | | G02F 1/133617 349/61 |
| 2005/0276295 A1* | 12/2005 | Kahen | | G02F 1/133603 372/39 |
| 2006/0098285 A1 | 5/2006 | Woodgate et al. | | |
| 2007/0052660 A1* | 3/2007 | Montbach | | G02B 26/005 345/102 |
| 2011/0020566 A1 | 1/2011 | Koch | | |
| 2011/0186890 A1 | 8/2011 | Rothe | | |
| 2012/0235124 A1* | 9/2012 | Strevens | | H01L 51/441 257/40 |
| 2012/0242949 A1* | 9/2012 | Chen | | G02B 5/3083 349/194 |
| 2012/0320298 A1 | 12/2012 | Suzuki et al. | | |
| 2014/0008620 A1* | 1/2014 | Morohashi | | H01L 51/5203 257/40 |
| 2015/0325813 A1* | 11/2015 | Haag | | G02B 27/281 257/40 |

FOREIGN PATENT DOCUMENTS

| | | | | |
|---|---|---|---|---|
| WO | WO 2007004106 A1 * | 1/2007 | ......... | H01L 51/5265 |
| WO | WO2007004106 A1 | 1/2007 | | |
| WO | WO 2009086911 A1 * | 7/2009 | ............ | C09K 19/18 |
| WO | WO2009086911 A1 | 7/2009 | | |
| WO | WO2010117272 A2 | 10/2010 | | |

OTHER PUBLICATIONS

Y. Kurioz, "P-128: Orientation of a Reactive Mesogen on Photo-sensitive Surface," vol. 38, Issue 1, pp. 688-690, May 2007.

* cited by examiner

PHOTOACTIVE BIREFRINGENT MATERIALS IN OLEDS

CROSS-REFERENCE TO RELATED APPLICATIONS

This application is the U.S. National Phase of, and Applicants claim priority from, International Patent Application Number PCT/NL2014/050898 filed Dec. 22, 2014, which claims priority from EP 13199336.2 filed Dec. 23, 2013, each of which is incorporated herein by reference.

FIELD

The invention relates to an OLED arranged to emit light having different colours, comprising a multi-layered structure provided with a first electrode, a second electrode and a functional layer enabling light emission disposed between the first electrode and the second electrode.

The invention further relates to an electronic device comprising such an OLED. The invention further relates to a method of manufacturing an OLED.

BACKGROUND

An embodiment of an OLED capable of emitting light having various colours is known from WO 2006/087654. In the known OLED an anode layer is provided on a suitable substrate, which is followed by a hole-injection layer followed by a layer of a light emissive material, having certain thickness along the substrate, above which a cathode layer is deposited.

OLEDs for signage applications typically require photolithography and wet-etching of layers to define the active area in the desired shape. Changing the topography of the OLED active area may lead to failure of those devices since the topography induces undesired thickness variations that make the device susceptible to catastrophic shorts. It is known that accuracy of thickness modulation of the light-emitting layer may affect the microcavity of the OLED system. Dimensioning the microcavity, with the effective wavelengths of the optical materials controls the outcoupling of the light emission. For example, a typical OLED stack may comprise a layer of a light-emitting polymer (LEP) cooperating with a hole injection layer and also possibly with an electron injection layer. In K. Neyts 'Simulation of light emission from thin-film microcavities", J. Opt. Soc. Am A Vol 15, No 4, April 1998, it is discussed how thicknesses of the optical stack may contribute to constructive or destructive interference, which will result in enhanced or reduced emission of light from the OLED.

This theory has resulted in a rigorous prescription of layer thicknesses to be used in the construction of the OLED stack. In WO2010117272 a proposition is made to provide a sub-layer of the OLED stack which is modulated in thickness, in order to optimize emission properties for certain wave lengths. A device according to the invention, comprising an OLED as is discussed with reference to the foregoing, may relate to a sensor, a display unit, a lighting arrangement or a signage unit.

However, tuning the thickness of the OLED stack may induce differences in electrical and optical behaviour, which is in practice challenging to control.

SUMMARY OF THE INVENTION

It is an object of the invention to provide an OLED capable of emitting light of different colours using a modulated functional layer, wherein such modulation is obtained with high accuracy and reproducibility, but is also achieved using a very simple and fast technique.

To this end, according to an aspect an OLED is provided according to the features of the independent claim. In particular, the OLED comprises a multi-layered structure having at least two reflective interfaces, wherein at least one of the reflective interfaces is semi-transparent to form a microcavity in between the two reflective interfaces; and a semiconducting organic layer sandwiched between first and second electrodes included in the microcavity; wherein a layer is provided formed of a photoactive birefringent material, in the microcavity between one of the first and second electrodes and one of the at least two reflective interfaces; and wherein the photoactive birefringent material is selectively activated.

Reference is made to WO2009086911A1 disclosing some photoactive birefringent material, also known as reactive mesogens or RMs.

RMs can be used to make optical films, like compensation, retardation or polarisation films, e.g. for use as components of optical or electrooptical devices like LC displays, through the process of in-situ polymerisation. The optical properties of the films can be controlled by many different factors, such as mixture formulation or substrate properties. The optical properties of the film can also be controlled by changing the birefringence of the mixture. This determines the necessary thickness for a given retardation at a particular angle as well as controlling the birefringence dispersion. High birefringence materials also give high birefringence dispersion whilst low birefringence materials give low birefringence dispersion.

The dispersive power of an RM film can be defined in many ways, however one common way is to measure the optical retardation at 450 nm (R450) and divide this by the optical retardation measured at 550 nm (R550) to obtain the ratio R450/R550.

The origin of the retardation dispersion is due to the fact that the two refractive indices ne, n0 of the anisotropic molecules (wherein ne is the "extraordinary refractive index" in the direction parallel to the long molecular axis, and n0 is the "ordinary refractive index" in the directions perpendicular to the long molecular axis) in the anisotropic film change with wavelength at different rates, with ne changing more rapidly than n0 towards the blue end of the spectrum. One way of preparing a material with high retardation dispersion is to design molecules with increased ne dispersion whilst keeping n0 dispersion largely unchanged.

The RM film may be formed as polymerisable material, preferably a polymerisable liquid crystal material, optionally comprising one or more further compounds that are preferably polymerisable and/or mesogenic or liquid crystalline. The RM film may be formed as an anisotropic polymer obtained by polymerising a polymerisable LC material preferably in its oriented state in form of a thin film.

Throughout the application, the term "sandwich" in "sandwiched layer" is used, unless otherwise indicated, to indicate that a layer is formed between two other layers, i.e. sandwiched there between, without necessarily being adjacent i.e. in direct physical contact to each other. Thus in a stack having subsequent (adjacent) layers numbered 1, 2, 3 and 4, layer 2 is sandwiched between layers 1 and 3 but also between layers 1 and 4. Layer 1 is however not sandwiched between layers 2 and any of subsequent layers 3 or 4.

Microcavities are challenging to predict without software. The impact that a birefringent material has on the light emission of a device can thus not be estimated up front.

Especially the preservation of emission color as well as an improvement of color homogeneity is unpredictable. The present invention provides a means to further optimize these aspects without compromising the electrical system of the OLED.

When instead of a standard material a photoactive birefringent material is used, patterning inside the OLED area may become an obsolete step. RMs are polymerizable liquid crystals. The liquid crystalline monomers carry, for example, reactive acrylate end groups, which polymerize with one another in the presence of photo-initiators and UV light to form a rigid network. The orientation of the liquid crystal molecules is "frozen" due to mutual polymerization of their ends. By illuminating the RM material, the refractive index in xy and z direction may be altered. This change induced by UV irradiation is accompanied by a contrast in the output of the OLED leading to the appearance of a pattern. Single photoactive birefringent layer in top emission design generates a remarkably high contrast in brightness upon UV irradiation of thin layer of a photoactive material.

In addition, surprisingly, it is found that the photoactive birefringent layer can have a major effect in stabilizing the color variation with angle, which is a great benefit over other solutions.

Furthermore, a benefit of this technique is that no high accuracy development step is required to remove the photoactive birefringent layer from the active layer upon exposure. For reducing any water ingress from the side of the device inwards it is quite a benefit that this material can be removed outside the active area and can be covered with a one or more dense and thin films that separates the semiconducting layer between the two reflecting interfaces from the organic layer.

Furthermore, the OLED's active area is defined by the design of the OLED, not the exposed photoactive birefringent layer. Furthermore, the photoactive birefringent layer is part of the device structure, but can be electrically inactive. It may also planarize any small defects of the metal mirror and help to reduce failure due to electrical shorts. The photoactive birefringent layer is thin enough still to allow efficient emission from the top emission OLED. Importantly, the disclosed technique is suitable for flexible OLED processing using reel to reel methods.

According to another aspect a method of manufacturing an organic light-emitting diode (OLED) is provided, comprising the steps of:
providing a multi-layered structure having at least two reflective interfaces and a semiconducting organic layer sandwiched between first and second electrodes; wherein at least one of the reflective interfaces is semi-transparent to form a microcavity in between the two reflective interfaces;
providing a layer formed of a photoactive birefringent material, in the microcavity between one of the first and second electrodes and a one of the at least two reflective interfaces; and
selectively activating the photoactive birefringent material It will be appreciated that the method of invention may comprise the step of depositing further layers of the diode. In particular, when the semiconducting organic layer comprises a plurality of sublayers, such as a light-emitting layer superposed on the hole injection layer or the electron injection layer, the method according to the invention comprises the step of depositing the light emitting layer in addition to said hole injection layer and/or said electron injection layer.

In an embodiment of the method according to the invention the first electrode layer and/or the second electrode may be reflective or partially reflective. Alternatively, for the substrate a metal foil or a reflective material provided on a glass or plastic foil may be used. It will be appreciated that a semi-transparent reflective interface will transmit a substantial part of the light, i.e. more than 10%, or even more than 50% of the visible light. Furthermore, it will be appreciated, that birefringence may be present in a variety of materials. The origin of the retardation dispersion is due to the fact that the two refractive indices ne, n0 of the anisotropic molecules (ne being the extraordinary refractive index in the direction parallel to the long molecular axis, and n0 being the ordinary refractive index in directions perpendicular to the long molecular axis) in the anisotropic film change with wavelength at different rates, with ne changing more rapidly than n0 towards the blue end of the spectrum. For example, a typical difference between n0 and ne may be in the order of 0.1-0.5. In addition it is noted that some materials typically used in the production of OLED devices, for example, PEDOT:PSS exhibits birefringence. This material is a hole injection layer with very limited difference between refractive indices ne and n0 that is not clearly visible once the device is finished. Its birefringence is usually ignored.

Furthermore, JP4350969 discloses a birefringent layer which is provided on the air interface or below to optimize the angle of total internal refection. Importantly, these materials do not have selectable photoactive properties. Furthermore, it is noted that a suitable photoactive material is known from WO2009/086911. While the disclosure contemplates the use of photoactive materials in OLED devices for signage, it's purpose is very different from the present disclosure since it fails to disclose a layer formed of a photoactive birefringent material that is provided in the microcavity between an electrode and a reflective interface.

These and other aspects of the invention will be discussed in more detail with reference to drawings, wherein like reference numerals refer to like elements. It will be appreciated that the drawings are presented for illustrative purposes and may not be used for limiting the scope of the appended claims.

DETAILED DESCRIPTION OF THE DRAWINGS

Figure 1:
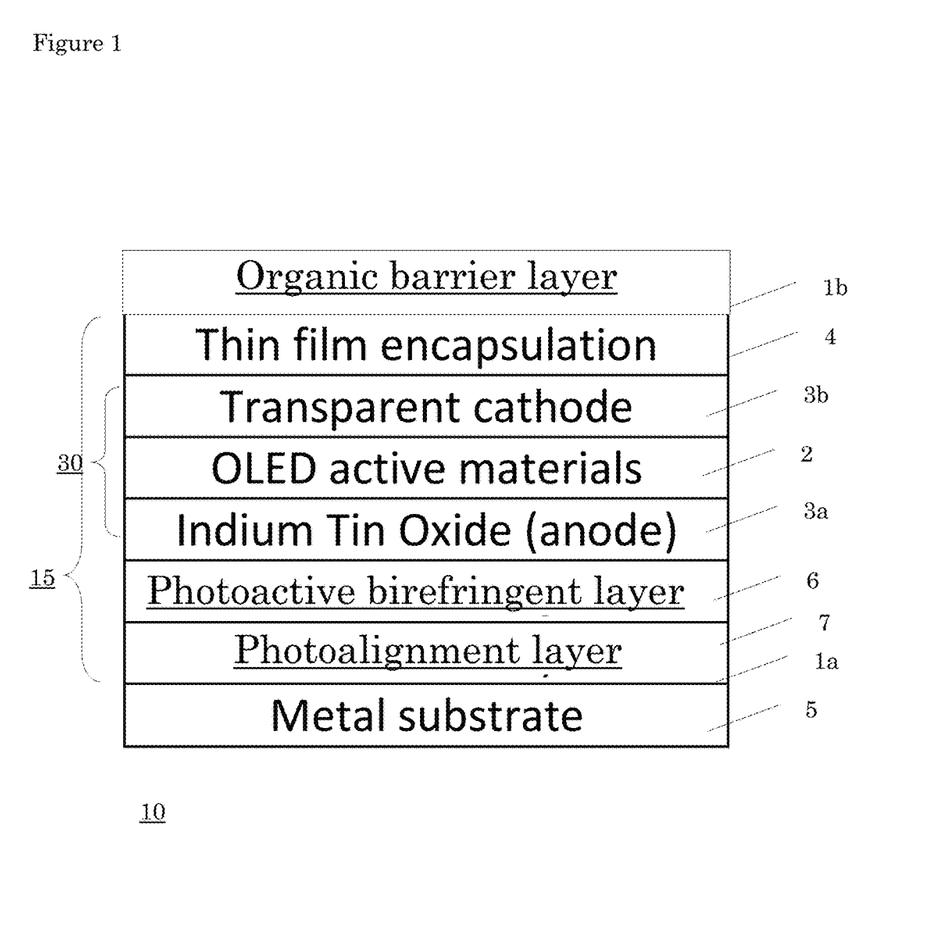
FIG. 1 presents in a schematic way an embodiment of a cross-section of an OLED according to the invention.

FIG. 1 presents in a schematic way an embodiment of a cross-section of an OLED according to the invention. In the organic light-emitting diode (OLED) a multi-layered structure 10 is provided having at least two reflective interfaces 1a, 1b, and a semiconducting organic layer 2 sandwiched between first and second electrodes. Reflections on interfaces 1a, 1b can be provided by relatively large differences of subsequent layers each having distinct refractive indices. The top side interface is 1b is formed by a reflective system of semi-transparent dielectric layers. This system is formed, in the example, by the interface of the capping layer 4 (thin film encapsulation) and an organic barrier (OCP) layer provided thereon. Alternatively, cathode 3b could form a semi-transparent reflective layer. The other one of the at least two reflective interfaces is the interface 1a formed by a reflective metallic substrate film 5.

Between interfaces 1a, 1b microcavity 15 is formed that constructively outcouples certain wavelengths, depending on the optical path lengths formed by the layers and their respective refractive indices, in the multi-layered structure 10 between the reflective interfaces 1a, 1b. In the microcavity 15, between a metal substrate 5 forming a reflective interface 1a and anode 3a photoactive birefringent material layer 6 is provided. According to an aspect of the invention the birefrigent material (reactive mesogen, RM) 6 changes in conformation upon selective UV irradiation, resulting in a refractive index difference parallel and perpendicular to the substrate plane.

According to certain embodiments, the selective activation of the material may be a patterned form, according to a signage pattern.

In another embodiment, micro-patterning may be provided, in order to enhance optical path behaviour for certain wavelengths, for example colour dithering. In another embodiment, selective activation may render a uniform birefringence, having the extraordinary refractive index ne, in the direction parallel to the long molecular axis, and ordinary refractive index n0, in the directions perpendicular to the long molecular axis in the anisotropic film are oriented in a predefined orientation that is rotated respective to the un-activated form. For example, in the un-activated form the reactive mesogen molecules may be oriented in a plane parallel to the substrate plane 5 with respect to their long molecular axis. In the activated form, selective out-of-plane freezing may be attained, wherein the reactive mesogen molecules are oriented, with their long molecular axis, in a direction out of plane respective to the substrate plane 5. In a manner that can be controlled selectively, the average orientation relative to the metal substrate plane of the reactive mesogen molecules will render an effective refractive index seen direction normal to the metal substrate, which defines the optical path length in the micro cavity 15.

In this way, depending on the activation pattern of the photoactive birefringent layer 6, the microcavity 15 can be tuned to emit radiation by constructive interference, or, depending, the microcavity 15 can be tuned to block, in part or in total, radiation from the electro-optical stack 30 by destructive interference. In practice light emitting intensity in areas of the photoactive layer 6 displaying constructive interference compared to a light emitting intensity in areas of the photoactive layer 6 displaying destructive interference can have contrast ratios of in the order of 5-100:1; more specifically in the order of 25:1.

In the embodiment of FIG. 1, the substrate layer is formed by a metal substrate 5, and anode 3a is formed by a transparent indium tin oxide layer. In this embodiment, conveniently the anode 3a is sandwiched between the birefringent layer 6 and the second electrode 3b. This has the advantage, that the photoactive birefringent layer, which is typically an electrically insulating layer, is not enclosed in the electro-optical stack 30 formed by the functional materials 2 between electrodes 3a and 3b, so that the electrical properties of the OLED stack 10 are largely unaffected. In the shown embodiment, the photo-active birefringent layer 6 is provided in a light path between the metallic substrate film 5 and the semiconducting organic layer 2. This has the advantage that the birefringent layer can be oriented with some ease and may form a suitable substrate layer for the electro-optical stack, which is very sensitive to planarity. Alternatively, the birefringent film could be provided on the top side of the OLED, i.e. for example, between the transparent cathode 3b and the thin film encapsulation layer 4, provided the film is formed within the microcavity 15.

While in some embodiments it is foreseeable that the photoactive birefringent layer may be provided without a pre-alignment layer, for example, by suitable physical preparation of a metalized plastic (i.e. rubbing); preferably, the photoactive birefringent layer is provided on a photo-alignment layer, in a way that alignment is provided by the photo-alignment layer having a function constructed for the purpose of alignment. In this respect, reference is made to the materials described in Y. Kurioz, "P-128: Orientation of a Reactive Mesogen on Photosensitive Surface" Volume 38, Issue 1, pages 688-690, May 2007 wherein photoaligning polymers are discussed that contain derivatives of cinnamic acid in the side fragments of different main chains (polyvinylalcohol, polysiloxane, cellulose). The photoaligning properties of these materials are caused by anisotropic dimerization of side fragments at irradiation with polarized UV light and possible trans-cis isomerisation of the cinnamoil fragments. The cellulose-based cinnamate polymers possess photosensitivity and provide a high quality alignment of most commercial nematic LC mixtures after UV exposure.

Figure 2:
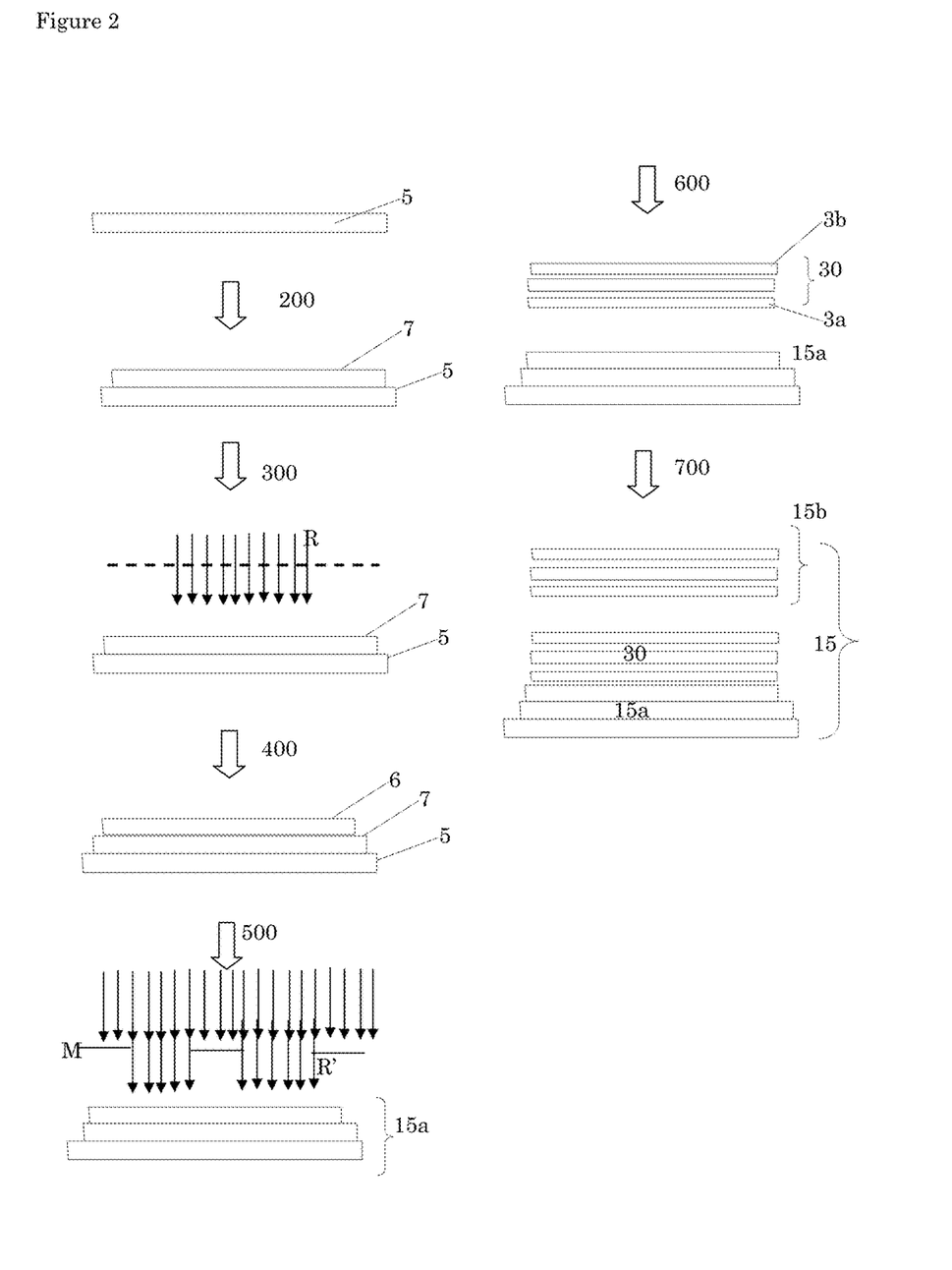
FIG. 2 presents schematically a process for manufacturing an OLED according to the embodiment of FIG. 1.

FIG. 2 presents schematically a process for manufacturing an OLED according to the disclosed embodiments.

In optional step 200, a photo-aligning material 7 is provided on a reflective substrate 5. Preferably, the thickness is as low as possible, for example several (tens of) nanometers. Coating can be provided by spin-coating at room temperatures but also reel to reel application is possible.

After depositing step 200 an annealing step 300 is performed, for example, at about 80 deg. Celcius, wherein the photo-alignment 7 is cured by UV radiation R. The radiation may be performed with a patterned exposure to UV light e.g. of an Hg-lamp to form the alignment structure.

In Step 400 a photoactive birefringent material layer 6 is provided in the microcavity between an electrode and a reflective interface formed of a metal substrate 5; and after subsequent step 500 may be selectively activated by photopattering e.g. by a mask exposure R' or alternatively, maskless exposure. The mask M may be provided with a suitable pattern e.g. a signage pattern. Alternatively, the patterning of previous photo alignment step 300 imposes a desired patterning e.g. by thermal annealing. Accordingly, a bottom structure 15a of a microcavity is formed, wherein the photoactive birefringent material 6 is selectively activated and wherein metallic substrate 5 forms a reflective interface.

In subsequent steps 600 deposition of a transparent electrode material, e.g. of Indium Tin Oxide, is performed on structure 15a, with thermal annealing at reduced temperatures, for instance 120 deg. Celcius, patterning, to form the anode 3a of a multi-layered structure 30, further provided by subsequent provision of semiconducting organic layers sandwiched and cathode 3b. To encapsulate the OLED, thin film structure 15b is provided in subsequent steps 700, to form a microcavity 15 including two reflective interfaces 15a, 15b; at least one of them being semi-transparent. Steps 200-500, or more specifically all steps are suitable for carrying out in a roll-to-roll process.

Figure 3:
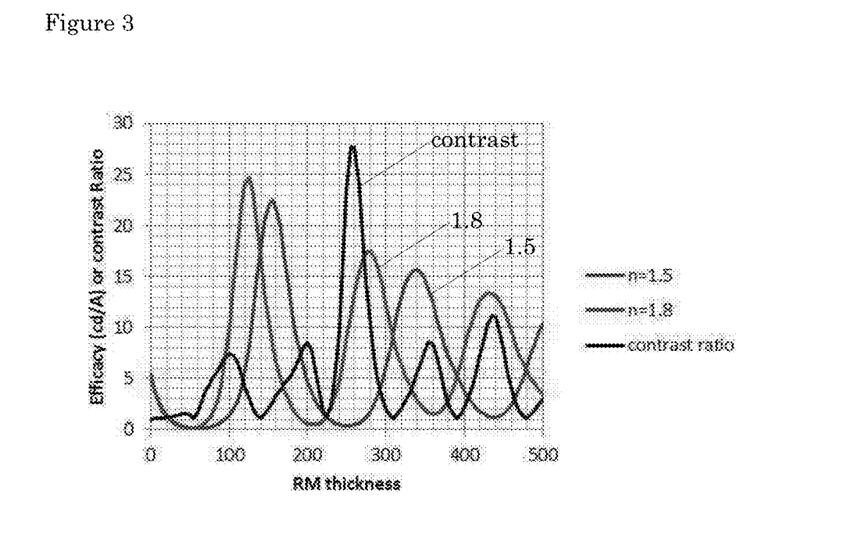
FIG. 3 represents an efficacy diagram for a flexible green top emission OLED having the birefringent layer for the differing refractive indices.

FIG. 3 represents an efficacy diagram for a flexible green top emission OLED having the birefringent layer for the differing refractive indices, for a birefringent layer of certain thicknesses. The figure correspondingly shows a contrast ratio. In the diagram, the layer thickness ranges between 0 and 500 nm, having an optimum contrast ratio of about 20-25:1 at a layer thickness of about 250-280 nm for a flexible green top emission OLED. It is found that for 1.5 and 1.8 the color is nearly identical at normal viewing angles.

Important is also that the efficiency of the device at the unactivated region is severely diminished by selecting a thickness that maximizes the contrast ratio. The figure also shows the efficacy at a viewing angle normal to the substrate plane as a function of thickness for refractive indices n=1.5 and n=1.8 and their contrast ratio. Both curves are not perfectly out of phase at the contrast maximum at 440 nm. The reason for this is that with increasing RM thickness, the efficacy decreases since the microcavity becomes weaker. No other combined optimum in efficacy and contrast ratio is possible to occur for this embodiment.

Surprisingly, in a specific thickness range of the photoactive birefringent layer, it is shown that OLEDs can indeed potentially be manufactured with undeveloped layers that upon irradiation with a specific pattern show an extreme increase in efficiency with minimal color change.

Figure 4:
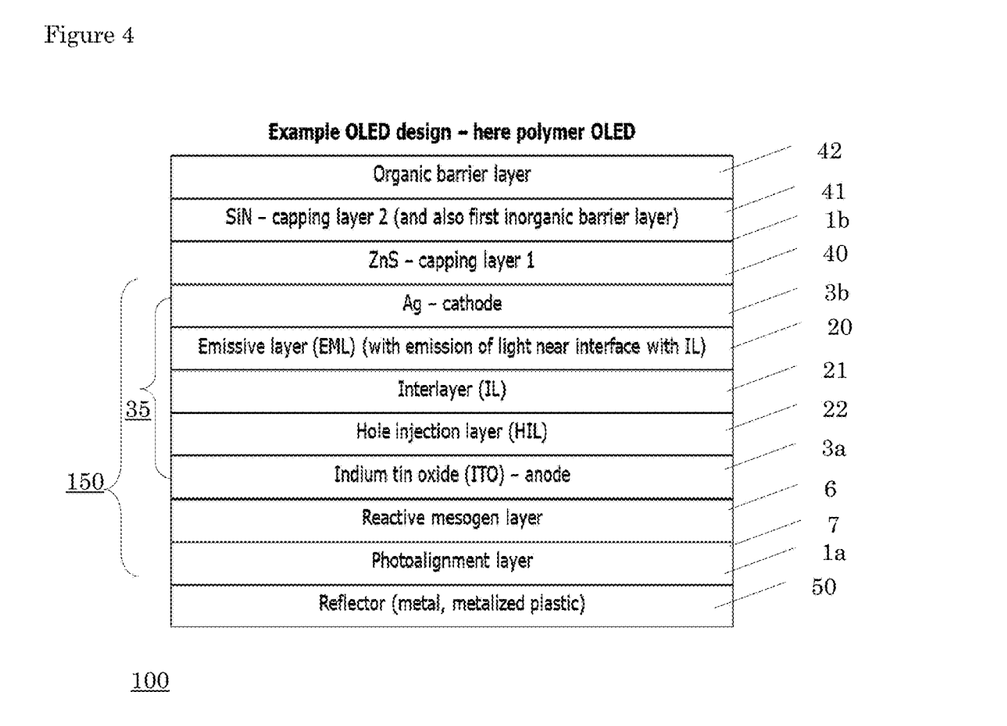
FIG. 4 shows a practical embodiment of an OLED having a the photoactive birefringent layer

FIG. 4 shows a practical embodiment of a top-emissive OLED 100 having the photoactive birefringent layer 6 optimized for green emission from a fluorescent light-emitting polymer, e.g. (spiro-)fluorene copolymer. Alternatively light-emitting copolymers containing metal-based complexes can be used instead. In addition, small molecule materials with emission originating from fluorescence or phosphorescence can be used. Hole and electron injection layers with optimal work functions may be used to facilitate charge injection at the electrodes, but preferably such layers are doped with heterogeneities that create Ohmic interfaces leading to charge barrier free injection. Furthermore, the OLED may comprise one or more charge blocking layers, such as the IL (interlayer) in FIG. 5. While in FIG. 5, the IL is formed by depositing a polymer based on similar monomers as the light emitting material, but in different compositions, it is known that small molecule based materials can be used instead. Moreover, the OLED is not limited to a single light emissive unit. Instead, a multitude of light emitting elements can be stacked between the two reflectors with or without transparent charge generation layers, for instance based on thin metaloxide films. Here, the scope of the example is limited to a single emissive layer emitting monochromatic green light that was deposited on an electron blocking fluorene copolymer interlayer that itself covers a hole injection layer (thiophene-based). The birefringent layer 6 is provided at a thickness of about 273-278 nm. An electro-optical stack 35 comprises an ITO anode 3a, for example, of a thickness of about 30-40 nm. Thicker ITO layers, for better anode conductivity, can be achieved by reducing the thickness of the RM layer with a comparable amount. Furthermore, the stack comprises an hole injection layer 22, thickness about 30 nm, an interlayer 21, thickness about 16 nm, and emissive layer 20, thickness about 60-70 nm thick. The electro-optical stack 150 in the example is topped by an Ag-cathode thickness about 15 nm, making it largely transparent. Electron injection at the cathode can be facilitated by Ba/Al, each with a thickness preferably below 1 nm.

In the embodiment a capping is provided for electro-optical stack 150 by a layer 40 with refractive index above 1.7, preferably above 1.8, e.g. ZnS, ZnSe, $TiO_2$, $Ta_2O_5$, provided on the semi-transparent cathode, and a dense inorganic layer with refractive index above 1.7, preferably above 1.8, e.g. SiN layer 41 provided on the ZnS layer 40, functioning as a (first) inorganic barrier layer. The inorganic layer 41 is covered by an organic barrier layer 42, optionally covered by further inorganic and organic barrier layers (not shown). The ZnS layer 40 is preferably about 30 nm thick, for example, 25-35 nm, and the SiN layer is preferably about 200 nm thick, for example, about 190-210 nm. By this arrangement a reflective interface 1b may be formed between the inorganic barrier coating 41 and organic barrier layer 42. As in the previous embodiment, the photo-alignment layer 7 is provided on the metallic substrate film 50, which may be a metal film or a metalized plastic film forming a first reflective interface 1a. Further intermediate layers may be present between the photoalignment layer 7 and substrate 50, when suitably taking into account its transmissive optical properties for the microcavity 150.

The optical thickness of the emissive region 20 towards the reflective SiN/OCP interface 1b (first encapsulation layers) is 1 effective wavelength lambda of the emissive radiation, the effective wavelength being the wavelength in the medium, i.e. the wavelength in vacuum divided by the refractive index of the medium. More generally the optical of the emissive area 20 towards interface 1b is (½+½ n) effective lambda, where n is an integer. The total optical pathlength in the microcavity 150 is two times the effective lambda in the case of the first optimum (for n=1.5) or 2.5 effective lambda for the second optimum. In other words, the outcoupling is optimal when light is generated at a distance of multiples of ½ effective lambda from interface 1b. At the minimum, which is the preferred situation for maximizing contrast, the optical thickness is close to 2¼ effective lambda. The lowest calculated minimum occurs at 1¾ effective lambda. Maximum contrast occurs between a situations where the optical thickness for n=1.5 is close to or at a minimum and a situation where the optical thickness for n=1.8 coincides with a maximum as much as possible. Due to efficiency reasons, the total thickness of the microcavity 150 is preferably minimal.

Figure 5:
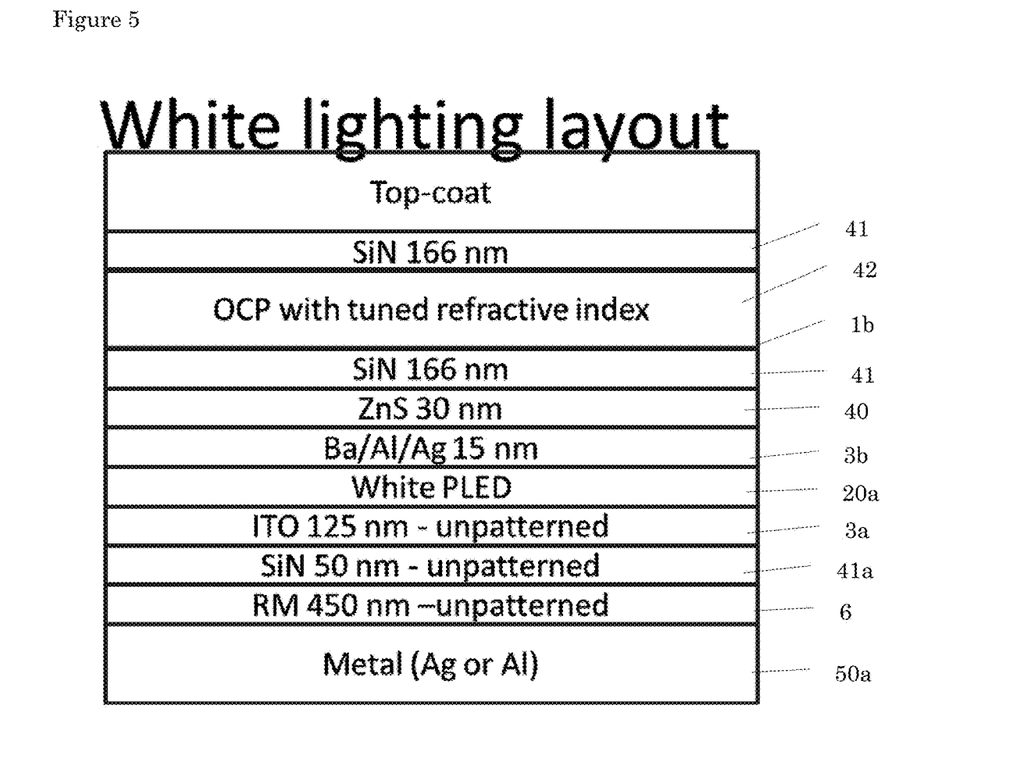
FIG. 5 shows a practical embodiment of a top-emission OLED optimized for white lighting

FIG. 5 shows a practical embodiment of a top-emission OLED optimized for white lighting. For this embodiment, the RM layer is unpatterned, but the birefringent nature of the RM layer, of for instance about 450 nm optimizes the white lighting OLED for larger viewing angles. Specifically, the stack is built up on a metal substrate 50a, for instance, of Ag or Al, where an unpatterned layer of RM material 6 is provided, of about 450 nm. The RM layer may 6 be shielded by a 50 nm shielding layer of SiN 41a that shields any outgassing of volatile substances including water from the RM layer. The electrooptical stack is formed by a white polymer light emitting diode (PLED) 20a sandwiched between ITO anode 3a and a cathode 3b provided with an electron injection layer. In the embodiment cathode 3b may be formed by a metal and may comprise an electron injection layer part formed by one or more optically reactive materials that facilitate charge injection. For instance, a 15 nm layer may be provided of Ba/Al/Ag. Other suitable electron injection materials may include Ca, LiF, CsF, NaF, BaO, CaO, $Li_2O$, $CsCO_3$. Since the layer thickness of the injection layer is only several nanometers, the topography of the stack remains optically uniform. The stack is capped by ZnS layer 40 of about 30 nm and a SiN layer 41 of about 166 nm. The top layers are provided by an alternating stack of OCP (Organic Coating for Planarization) 42 and SiN layers 41, ending in one or more layers to shield SiN layer 41 from outside influences such as scratches, for instance another OCP layer. While the embodiment shows layers with thicknesses of optimal values, naturally the skilled person will understand that a variation of about +−10 15% of the layer thickness may still yield optimal results.

Figure 6:
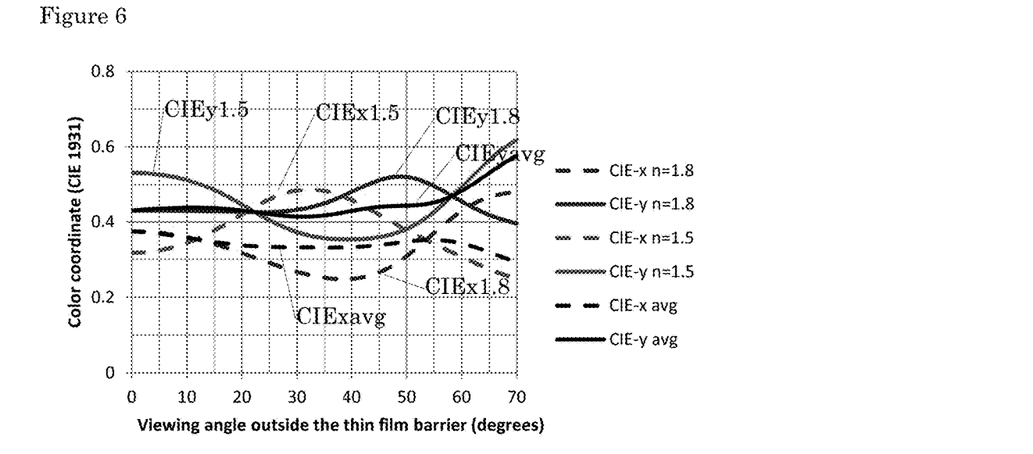
FIG. 6 shows a CIE color coordinate diagram associated with the embodiment of FIG. 6.

FIG. 6 shows a CIE-1931 color coordinate diagram associated with the embodiment of FIG. 6; Importantly, it is shown that the CIEx and CIEy color coordinates remain virtually constant i.e. yield values within 20% for angles (relative to the normal) between 0 and 55 degrees.

Figure 7:
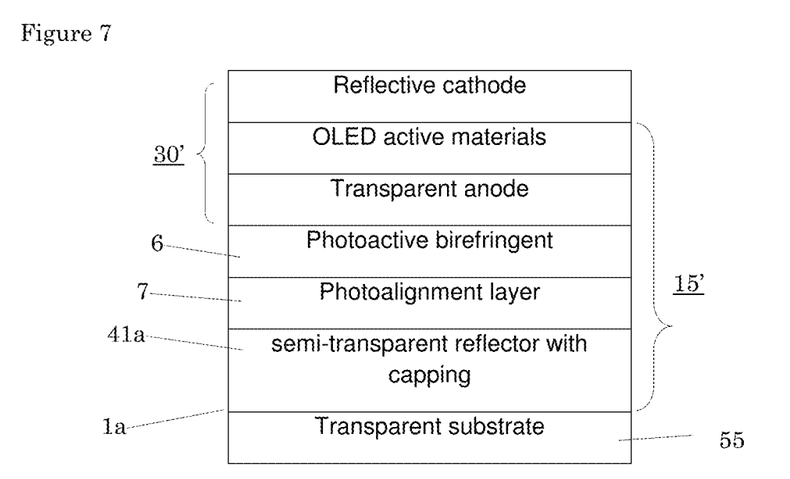
FIG. 7 shows an alternative functional stack for a bottom emission embodiment.

FIG. 7 shows an alternative functional stack for a bottom emission embodiment. In this embodiment, the RM layer is provided on a transparent substrate eg. translucent polymer layer 55. As an alternative to the top emission embodiments of FIGS. 6 and 8, also here one of the electrodes (e.g. transparent ITO anode) is sandwiched between the birefringent layers 6, 7 and the reflective second electrode (cathode). It is noted that anode and cathode may be interchanged provided their transparencies remain the same. The semi-transparent reflector 41a creates optical cavity 15' that also includes RM layer 6 and photo alignment layers 7. Similar to previous example, layers 6 and 7 reside outside the electro-optical stack 30'. The semi-transparent reflector may be formed by a metallic layer, preferably onto an electrically conductive or alternatively onto an insulating capping layer thereby forming a reflective interface 1a between capping layer and the transparent substrate 55.

Figure 8:
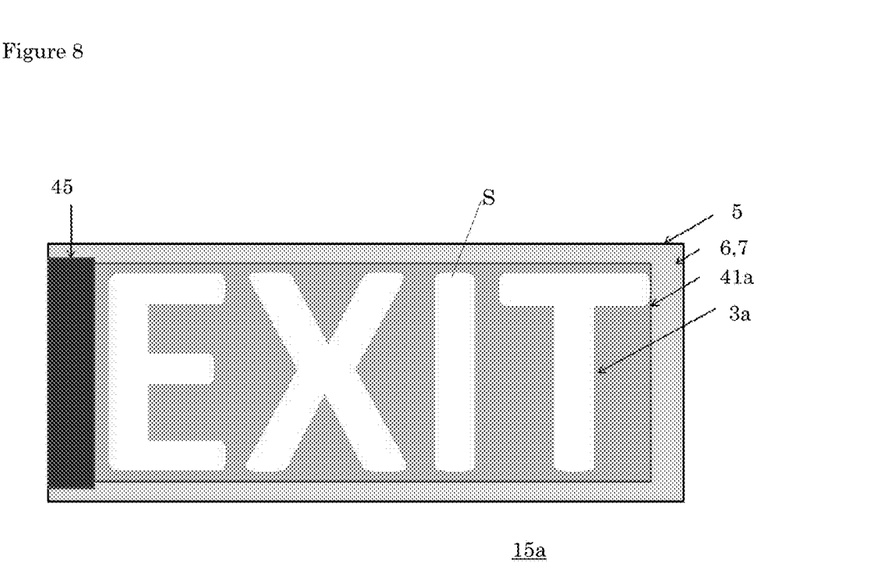
FIG. 8 shows a signage bottom stack having specific patterning.

FIG. 8 shows a signage bottom stack structure 15a having specific patterning; wherein a layer 6,7 is provided formed of a photoactive birefringent material, in the microcavity between one of the first and second electrodes (i.e. patterned ITO anode 3a) and one of the at least two reflective interfaces (i.e. the metal substrate 5. In order to provide sufficient electrical power to larger signage area S, the anode 3b may be electrically connected to a metal substrate by via connections 31. The bottom stack 15a may be provided with an unpatterned shielding layer, e.g. a SiN layer 41a provided to cover the RM layers 6, 7 in order to prevent outgassing of volatile substances including water. The shielding layer 41a may be bordered with an insulating border area 45 e.g. covering shielding layer 41a that may contact metal substrate 5 in the border area 45. The signage area S may be patterned in a roll to roll process, eg. by intermittent printing of the OLED or PLED materials on the bottom stack structure 15a.

In the embodiment the photoactive birefringent material layer 6 is selectively activated by UV radiation radiated through mask R'.

Figure 9:
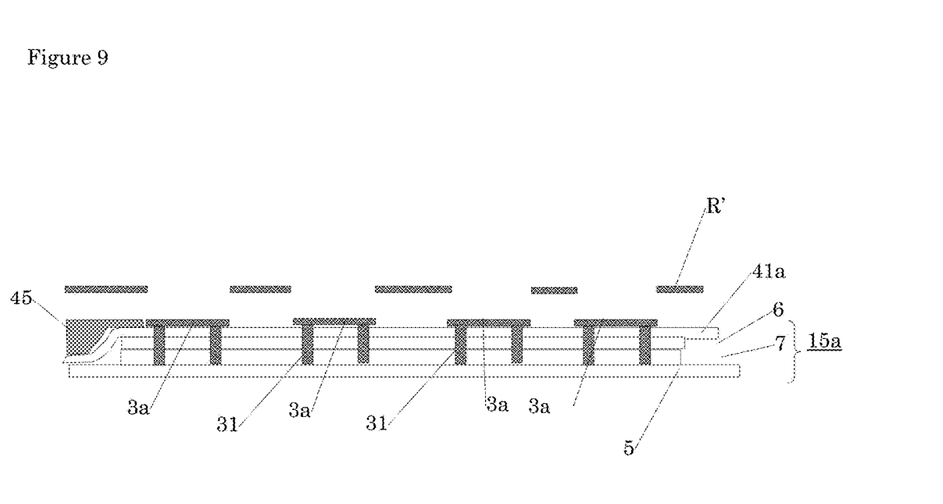
FIG. 9 schematically shows a side view of the bottom stack of FIG. 8.

FIG. 9 schematically shows a side view of the bottom stack 15a of FIG. 9. The stack 15a shows a multi-layered structure 15 comprising a metallic substrate film 5 to form one of the reflective interfaces, wherein the photoactive birefringent layer 6 is provided in a light path between the metallic substrate film 5 and a light emitting semiconducting organic layer to be deposited on patterned ITO layer 3a functioning as anode. The cathode (not shown) may be electrically isolated from the base substrate 5 and anode 3b by insulating border 45. Signage mask R' of step 500 or corresponding mask part can be (re)used to pattern the electron injection layer part to further enhance the contrast ratio. In processing the bottom stack 15, conveniently, mask R' may be supported by outer isolation 45, which may form a slight protrusion, e.g. in the order of several 100 micron. The signage mask R' may accordingly be used for irradiating the RM layer 6 through mask R' with a UV dose to selectively activate the photoactive birefringent material layer 6; optionally; after creation of via 31 covering the RM layer with a patterned electrode 3a; d) selectively reusing the mask for suitable application of hole or electron injection layer. Hole injection layers may, by way of example, be formed by any of the following materials PEDOT:PSS; Polyaniline; m-MTDATA (4,4',4"-Tris[(3-methylphenyl) phenylamino]triphenylamine); carbonitriles, such as HAT-CN, PPDN; phenazines (HATNA); quinodimethanes, such as TCNQ and F4TCNQ; Phthaocyanine metalcomplexes (including Cu, Ti, Pt complexes); Aromatic amines including fluorene moieties, such as MeO-TPD, MeO-Spiro-TPD; benzidines (such as NTNPB, NPNPB). The OLED stack may furthermore comprise material layers known to the skilled person, e.g. hole transport layers; material layers for emissive phosphorescent dyes (e.g. Ir(III) emitters) and electron transport & hole blocking layers e.g. formed of Quinolinolato metal complexes, like Liq, BAlq; Benzimidazoles (such as TPBi); Oxadiazoles (such as PBD, Bpy-OXD, BP-OXD-Bpy); Phenanthrolines (such as BCP, Bphen); Triazoles (such as TAZ, NTAZ); Pyridyl compounds (such as BP4mPy, TmPyPB, BP-OXD-Bpy); Pyridines (such as BmPyPhB, TpPyPB); Bathocuproines and Bathophenanthrolines, oxadiazoles, triazoles, quinoline aluminum salts.

Similar to the embodiment of FIG. 2, as an alternative to the stack 15a shown in FIGS. 8 and 9, bottom stack may be formed (bottom to top) by a metal substrate 5, a SiN layer 41a selectively provided to define a signage area S by electric isolation; an PA/RM layer 6,7 covering the SiN layer 41a, the PA/RM layer irradiated with signage mask if to provide signage pattern S. A homogenous ITO layer may then be provided shielding the PA/RM layer and functioning as anode layer. By the patterning of the PA/RM layer optical contrast is achieved to show the signage pattern S similar to the embodiment of FIG. 2. Depending on the activation pattern of the photoactive birefringent layer 6, microcavity 15 can be tuned to emit radiation by constructive interference, or, depending, the microcavity 15 can be tuned to block, in part or in total, radiation from the electro-optical stack 30 by destructive interference.

It will be appreciated that while specific embodiments of the invention have been described above, that the invention may be practiced otherwise than as described. In addition, isolated features discussed with reference to different figures may be combined.

The invention claimed is:

1. An organic light-emitting diode (OLED) system comprising a multi-layered structure having at least two reflective interfaces, and a semiconducting organic layer sandwiched between first and second electrodes; wherein at least one of the reflective interfaces is semi-transparent to form a microcavity in between the two reflective interfaces; wherein a layer is provided formed of a photoactive birefringent material, in the microcavity between one of the first and second electrodes and one of the at least two reflective interfaces; and wherein the photoactive birefringent material is activated in a patterned form resulting in a patterned refractive index of the birefringent material for in plane and out of plane directions in the microcavity to thereby form a patterned OLED.

2. An organic light-emitting diode according to claim 1, wherein the multi-layered structure comprises a metallic or metalized substrate to form one of the reflective interfaces, and wherein the photoactive birefringent layer is provided in a light path between the metallic substrate and the semiconducting organic layer.

3. An organic light-emitting diode according to claim 1, wherein the first electrode is sandwiched between the birefringent layer and the second electrode.

4. An organic light-emitting diode according to claim 1, wherein the photoactive birefringent layer is provided on a photo-alignment layer.

5. An organic light-emitting diode according to claim 4, wherein the photo-alignment layer is provided on the metallic or metalized substrate.

6. An organic light-emitting diode according to claim 1, wherein one of the reflective interfaces is formed by an interface of between an inorganic and an organic barrier layer.

7. An organic light-emitting diode according to claim 6, wherein the inorganic barrier layer comprises a layer with refractive index above 1.7, e.g. ZnS, and a SiN layer formed thereon.

8. An organic light-emitting diode according to claim 1, wherein one of the electrodes is semi-transparent thus forming one of the reflective interfaces.

9. An organic light-emitting diode according to claim 1, wherein the photoactive birefringent material is formed from liquid crystalline monomers carrying polymerizable groups, freezing the liquid crystalline monomers into a rigid network by photo-activation.

10. An organic light-emitting diode according to claim 4, wherein the photo-alignment layer comprises polymers that are formed by anisotropic dimerization.

11. An electronic device comprising the diode according to claim 1.

12. A method of manufacturing an organic light-emitting diode (OLED) system comprising:
   a. providing a multi-layered structure having at least two reflective interfaces and a semiconducting organic layer sandwiched between first and second electrodes; wherein at least one of the reflective interfaces is semi-transparent to form a microcavity in between the two reflective interfaces;
   b. providing a layer formed of a photoactive birefringent material, in the microcavity between one of the first and second electrodes and one of the at least two reflective interfaces; and
   c. selectively activating the photoactive birefringent material in a patterned form resulting in a patterned refractive index of the birefringent material for in plane and out of plane directions in the microcavity to thereby form a patterned OLED.

13. A method according to claim 12, wherein the photoactive birefringent material is provided on a photoaligning material.

14. A method according to claim 13, wherein the photoaligning material is provided on a reflective substrate forming one of the reflective interfaces.

15. A method according to claim 12 wherein a transparent electrode is provided on the photoactive birefringent material.

* * * * *